United States Patent Office 3,458,311

Patented July 29, 1969

3,458,311

PHOTOPOLYMERIZABLE ELEMENTS WITH SOLVENT REMOVABLE PROTECTIVE LAYERS

Francis Peter Alles, Basking Ridge, N.J., assignor to E. I. du Pont de Nemours and Company, Wilmington, Del., a corporation of Delaware No Drawing. Continuation-in-part of application Ser. No. 560,889, June 27, 1966. This application Dec. 15, 1967, Ser. No. 690,732

Int. Cl. G03c *1/94*

U.S. Cl. 96—35.1 13 Claims

ABSTRACT OF THE DISCLOSURE

Photopolymerizable elements having:

(a) a photopolymerizable stratum comprising an ethylenically unsaturated compound, (b) an addition polymerization initiator, and (c) an organic macromolecular polymer binder which may contain acid groups or salts thereof, and an adherent solid protective stratum transparent to actinic radiation, said protective stratum being characterized in that it has a weight of 2–30 mg. per square decimeter and is homogeneous, non-strippable as an unsupported film, substantially impermeable to oxygen, water-permeable and composed of a macromolecular organic polymer or polymer mixture that is soluble at 20° C. in water or in a mixture of water and a water-miscible organic solvent containing at least 50% by volume of water.

This application is a continuation-in-part of my application Ser. No. 560,889 filed June 27, 1966, now abandoned.

This invention relates to photopolymerizable elements useful for making printing plates.

Plambeck U.S.P. 2,760,863 discloses photopolymerizable elements with a strippable cover sheet. Heiart U.S.P. 3,060,026 discloses that a strippable, transparent sheet, when used as a protective cover sheet over a photopolymerizable stratum, during exposure overcomes the inhibiting effect of oxygen on the photopolymerization reaction. Strippable cover sheets are relatively expensive, require an extra step for removal, and are difficult to apply without trapping pockets of air between the cover sheet and the photopolymerizable stratum. Burg U.S.P. 3,203,805 discloses the use of a water-insoluble wax layer on a polymerizable stratum for thermal transfer image processes.

The novel photopolymerizable element of this invention comprises, in order, (1) a support which may embody an antihalation layer having coated thereon, (2) a photopolymerizable stratum having a weight of 1–90 (preferably 10–50) mg. per square dm. when dry and comprising:

- (a) at least one non-gaseous ethylenically unsaturated compound containing at least two terminal ethylenic groups, having a boiling point greater than 100° C. at normal atmospheric pressure and being capable of forming a polymer by photoinitiated addition polymerization,
- (b) an addition polymerization initiator activatable by actinic radiation, and
- (c) an organic macromolecular polymer binder for and compatible with said unsaturated compound, and (3) an adherent solid protective stratum transparent to actinic radiation, said protective stratum being characterized in that it has a weight of 2–30 mg. per square decimeter and is homogeneous, non-strippable as an unsupported film, substantially impermeable to oxygen, water-permeable and composed of a macromolecular organic polymer or polymer mixture that is soluble at 20° C. in water or in a mixture of water and a water-miscible organic solvent containing at least 50°% by volume of water.

Useful macromolecular organic polymers having the characteristics given above include polyvinyl alcohol and its partial esters, ethers and acetals that contain a substantial amount of unsubstituted vinyl alcohol units so that they have the requisite solubility in water. Suitable such polymers include 88% to 99% hydrolyzed polyvinyl acetate. Other useful polymers include gelatin, gum arabic, methyl vinyl ether/maleic anhydride copolymers, polyvinyl pyrrolidones, high molecular weight, water-soluble polymers of ethylene oxide having an average molecular weight of about 100,000 to 3,000,000 or more, and mixtures of these polymers.

Suitable photopolymerizable layers and supports include those described in the Plambeck and Heiart patents identified above, including supports bearing the various antihalation layers and adherent sublayers descrbed therein. Preferred supports are thin, flexible and have a hydrophilic surface, e.g. grained aluminum sheets and steel sheets. The photopolymerizable layers may contain dyes, pigments, fillers, thermal polymerization inhibitors, plasticizers, and other ingredients, including the specific ingredients of these types that are described in the Plambeck, Burg, and Heiart patents listed above and such materials or the chain transfer agents described in Barney, et al., U.S.P. 3,046,127. The latter agents can be in layer (3).

Useful specific polymer binders for layer (2) include those listed in the Plambeck and Heiart patents and those described later in this application. Preferred organic polymer binders contain acid or water-soluble salt groups, e.g., carboxyl and sulfonic groups. There can be insufficent acid groups to make the polymer soluble in a dilute sodium hydroxide alone but it should be soluble in a mixture of an organic solvent, water, and sufficient alkali to convert the majority of the acid groups to salt groups. A particular solvent mixture with isopropanol and water in a 10/90 ratio and containing 0.1% NaOH is useful, at room temperature, in removing the unexposed areas in elements comprising a combination of certain especially preferred binder materials and an ethylenically unsaturated compound that preferably is water-insoluble. The use of these especially preferred binder materials is disclosed below in the working examples, e.g. methyl methylacrylate/methacrylic acid and styrene/itaconic acid copolymers.

The protective stratum is applied from an aqueous or water/organic solvent solution of the macromolecular organic polymer and the resulting layer, after it is dried, has adequate adherence to the photopolymerizable layer and is so thin it cannot be stripped mechanically, unsupported, in one piece from the photopolymerizable layer. If a surfactant having wetting properties is present in the coating solution, more uniform layers result. The layer ordinarily is very thin, being approximately from 0.4 to 6.0 micron and preferably is removable in the conventional developer solutions used to form a printing relief after imagewise exposure of the photopolymerizable layer. The latter layer is removable imagewise whereas the protective layer is removable over the entire area of the element treated.

Useful surfactants include anionic, cationic and nonionic surface active agents, e.g., sodium alkyl sulfates and sulfonates of 12–18 carbon, e.g. sodium dodecylsulfate and sodium octadecylsulfonate; N-cetyl and C-cetyl betaines; alkylaminocarboxylates and dicarboxylates, and polyethylene glycols of average molecular weight below 400, etc.

The developer solution can be used as a bath or in the form of a spray. Removal of the unexposed areas of the photopolymerizable layer can be improved by brushing, by application of a wet sponge and rubbing, and by other known procedures. Such treatments aid in removal of layer (3) from the relief image.

The solvent media used to develop the exposed plates are aqueous media, i.e., water is the major constituent. Preferred developers also contain an organic solvent and an alkaline material. Suitable organic solvents include isopropanol, butanol, diacetone alcohol, 1-methoxyethanol, 2-ethoxyethanol and 2-n-butoxyethanol. Suitable alkaline materials include alkali metal hydroxides. Sodium metasilicate, triethanolamine, morpholine, trisodium phosphate, etc. The developer may also comprise a surface tension lowering or wetting agent. Other suitable ingredients of the developer solution include dyes, salts to control swelling, salts to etch the base metal, etc.

A preferred developer for the imagewise exposed elements of this invention is an isopropanol/water solution (10/90 by volume) containing 0.1%–0.3% by weight sodium hydroxide. Another very useful developer is 2-butoxyethanol/water solution such as developer "B" of Example VI.

The support preferably has a hydrophilic surface at the time the photopolymerizable layer is applied. Thus, when the plate is exposed and developed to remove the photopolymerizable layer in the unexposed areas, the areas of the support which are uncovered will be desensitized, i.e., they will repel a greasy or lipophilic ink while being receptive to water or aqueous solutions. However, the same end result can be obtained with a support having a surface which is initially less hydrophilic or even hydrophobic, e.g., a copper support. In such a situation, it is necessary to treat the developed plate with a material such as gum arabic (preferably in the presence of phosphoric acid) which adheres preferentially to the surface of the support in the uncovered ((unexposed) areas to protect and to make them hydrophilic. While gum arabic is the most common treating material for this purpose, similar results can also be obtained with such materials as alginic acid, sodium starch glycolate, and carboxymethyl cellulose. Even when the support initially has a hydrophillic surface, it is sometimes desirable to treat the developed plate with gum arabic or an equivalent material.

Preferably the support is thin and flexible, ranging from about .005 to 0.03-inch in thickness. Aluminum is commercially available in a wide variety of sizes. The aluminum may be untreated (except for the thin layer of oxide which forms immediately at its surface when exposed to air) or may have been provided with surface treatments or coatings to leave a hydrophilic surface. The surface can be roughened (mechanically, chemically or electrically) to improve retention of aqueous liquids and to improve adhesion to strata to be applied thereon. Other metals suitable for supports include tin-plated steel, stainless steel, aluminum clad steel, nonplated steel, galvanized carbon steel and zinc; plastic films, e.g. the polyethylene terephthalate films and copolymer coated films disclosed in U.S.P. 2,779,684; paper, cardboard, and resin coated or impregnated paper or carboard which may have a hydrophilic surface.

The invention will be further illustrated but is not intended to be limited by the following examples, wherein compositions are by weight unless otherwise indicated.

EXAMPLE I

A grained aluminum printing plate, the surface of which had been treated with aqueous sodium silicate, was coated with a solution of methyl ethyl ketone/isopropanol 3:1 containing 20% solids of the following composition:

| | |
|---|---|
| Poly[methyl methacrylate/methacrylic acid] (90/10 mole ration)[1] ____percent__ | 53.8 |
| Pentaerythritol triacrylate containing 0.4% of p-methoxyphenol as thermal inhibitor __percent__ | 44.1 |
| Tertiary butylanthraquinone ____do____ | 2.0 |
| Ethyl Violet (CI Basic Violet 4) dye ____do____ | 0.1 |
| Approximate coating weight, solids ___mg./dm.[2]__ | 87 |

[1] Intrinsic viscosity=0.094 using methyl ethyl ketone as solvent.

After drying, the plate was heated to 130° C. for 1 minute and cooled. The plate was overcoated with a 3% aqueous solution of polyvinyl alcohol(medium viscosity, 99% saponified) containing 2% of a polyoxyethylene surfactant of the formula

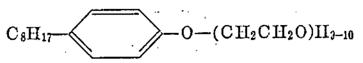

Coating weight of the photopolymerizable material was 86 mg./dm.$^2$ The polyvinyl alcohol coating weight was 12 mg./dm.$^2$ The plate was exposed for 30 seconds through a negative (21-step Lithographic Technical Foundation exposure wedge) in a vacuum frame, with a carbon arc[2] at a distance of 17 inches and operating at 45–50 amperes and 1200 watts, to yield a solid 7, i.e., the first 7 steps were polymerized sufficiently to resist removal by subsequent development. The plate was developed by washing out the unexposed parts of the coating using a developer of the following composition:

| | | Percent |
|---|---|---|
| 99% isopropyl alcohol ________ | (by volume)__ | 10 |
| Sodium hydroxide ____________ | (by weight)__ | 0.1 |
| Water ______________________ | (by volume)__ | 89.9 |

The plate was covered with the developer and allowed to soak for 30 seconds. The entire protective layer, along with the unexposed areas of the photopolymerizable layer, was removed by sponging. The developed plate was then rinsed with water and dried. The plate showed good ink/water characteristics, i.e., the exposed photopolymerized areas readily accepted lipophilic inks while the areas of the support from which unexposed photopolymerizable material had been removed accepted water readily. The plate ran satisfactorily on a wet offset press using a black printing ink and fountain solution.

EXAMPLE II

Another plate, prepared and processed as above, was coated with a commercially available gum etch composition.[3] which was applied after rinsing but before drying. The plate was then rubbed dry, inked and run on the duplicator press of Example I. The results were similar to those of Example I except that the plate was not susceptible to finger prints etc. in the nonprinting areas.

EXAMPLE III

Example I was repeated with the exceptions that the solvent was a 1:1 mixture of methyl ethyl ketone/isopropanol; the coating was cured for 2 minutes at 125° C.; and polyvinyl alcohol of medium viscosity and 88% saponified was used for the overcoating.

The plate (36½ inches x 42½ inches) was exposed and processed as in Example II. After drying, the plate was postexposed for 5 min. in a vacuum frame, using the same light source as in the original exposure. This plate was used to print 246,000 impressions. There were no visible signs of wear at the end of the run and the plate required no special attention during the run.

Another plate processed in the same way was used to print an abrasive pastel ink. After 103,000 impressions there was no sign of wear.

[2] Nu Arc "flip-top" Plate Maker, Mod. FT26M-2.

[3] Pitman's Super D Gum Etch comprising gum arabic.

EXAMPLE IV

A polished, untreated, aluminum sheet was cleaned in a vapor degreaser and then treated for 2 minutes in a commercially available chromium-containing composition[4] to obtain a chromium oxide surface. The plate was coated with a solution of the following composition by weight:

| | Percent |
|---|---|
| Poly[methyl methacrylate/methacrylic acid] (90/10) of Example I | 13.4 |
| Pentaerythritol triacrylate | 11.0 |
| Tertiary butylanthraquinone | 0.6 |
| Methyl ethyl ketone | 75.0 |

The coating was dried at 110° C. and cured for one minute at 130° C. Then a polyvinyl alcohol overcoating was applied as in Example I.

A printing plate was prepared by exposing through a negative as in Example I, developing in 0.1% sodium hydroxide in a 3:1 (by volume) mixture of water/isopropanol, rinsing with water, sponging with a solution containing 10% by weight zirconium oxychloride and 20% glycerol in water, rinsing with water and rubbing up with gum-etch of Example II. The resulting plate performed satisfactorily in a printing press.

EXAMPLE V

Steel plates, about 0.01 inch in thickness and electrically zinc plated, further treated by two different proprietary processes to yield hydrophilic surfaces, are commercially available.[5] These metal supports were coated with a composition like that of Example I except that methyl ethyl ketone was the solvent and the solids concentration was 18%. The coating was dried at 100° C., cured at 130° C. for 2 minutes, and a polyvinyl alcohol overcoating was applied as in Example I. The plates were exposed as in Example I and developed in a water/isopropanol 4:1 (by volume) mixture containing 1% sodium metasilicate. The plate performed satisfactorily on a printing press, showing good ink/water characteristics with no tendency to scum.

EXAMPLE VI

Example I was repeated except that exposed plates were treated in the following developer solutions, A through H. The plates developed in each of these solutions gave results essentially equivalent to those of Example I.

| | Developer, parts/100 in water (by volume) | | | | | | | |
|---|---|---|---|---|---|---|---|---|
| | A | B | C | D | E | F | G | H |
| Isopropanol | | | | | | | 20 | |
| Diacetone alcohol | | | | | | 12 | | |
| 2-ethoxyethanol | | | | | 5.0 | | | |
| 2-n-butoxyethanol | 2.0 | 6.0 | 4 | 4 | | | | 2.8 |
| Sodium hydroxide | | | | | 0.3 | | | 0.2 |
| Sodium metasilicate | | | | | | 1 | 1 | |
| Triethanolamine | | | 3 | | | | | |
| Morpholine | | | | 5 | | | | |
| Trisodium phosphate | 0.1 | 0.1 | | | | | | |
| $C_8H_{17}-C_6H_4-O-(CH_2CH_2O)H_{9-10}$ | 0.1 | 0.02 | | 0.1 | | | | |
| Alkane sodium sulfonate surfactant of 18 carbon atoms | | | | | | | | 0.7 |

EXAMPLE VII

The following composition was prepared as a 20% solution in 1:1 methyl ethyl ketone/isopropanol:

| | Percent |
|---|---|
| Poly [methyl methacrylate/methacrylic acid] (90/10) of Example I | 53.8 |
| Triethylene glycol diacrylate | 44.1 |
| Ethyl violet dye (C.I. Basic Violet 4) | 0.1 |
| Tertiary butylanthraquinone | 2.0 |

This composition was coated as in Example I and then overcoated with a 3% aqueous solution of polyvinyl alcohol (86–89% saponified, viscosity 19–25 centipoises in 4% aqueous solution at 20° C.) containing 2% (based on weight of polyvinyl alcohol) of the polyoxyethylene surfactant of Example I. A sample of the plate was exposed as in Example I (through the LTF–21 step exposure wedge) and another sample was given an exposure through a "signal strip" (a special test negative used to evaluate the plate for halftone dot fidelity). Both samples were developed in a solution of the following composition:

| | Percent |
|---|---|
| $C_8H_{17}-C_6H_4-O-(CH_2CH_2O)H_{9-10}$ | 0.1 |
| Trisodium phosphate | 0.1 |
| Sodium hydroxide | 0.2 |
| 2-n-butoxyethanol | 2.0 |
| Water | 97.0 |

The plate showed good ink/water differentiation, good adhesion to the plate support, good halftone dot quality and a number of satisfactory prints were obtained on a conventional printing press.

Similar results were obtained with a plate coated from a composition in which the monomer, triethylene glycol diacrylate, was replaced with the same quantity of trimethylolpropane triacrylate. However, when the polyvinyl alcohol overcoat was omitted there was an 8-fold loss in photographic speed.

EXAMPLE VIII

The composition of Example I, as a 20% solids solution in 1:1 methyl ethyl ketone, was coated on the grained aluminum plates of Example I to form a number of plates which were overcoated with water solutions of various oxygen impermeable layers at dry coating weights of about 12 mg./dm.$^2$. It was known that a plate without an oxygen barrier layer required about 8 times the exposure necessary for an otherwise identical plate overcoated with polyvinyl alcohol to obtain the same degree of polymerization, using a Lithographic Technical Foundation 21-step exposure wedge. This relatively large difference in exposure was used to select materials having low oxygen permeability.

Of the various protective overcoatings which were applied to the above plates, two produced resultant plates almost identical with the polyvinyl alcohol overcoated plate of Example I. These overcoatings were:

A—Gum arabic (applied from 12% aqueous solution)

B—Poly(methyl vinyl ether/maleic anhydride), 1:1 copolymer[6] having a specific viscosity of .1–.5 as deter-

[4] Chem-Rite A22 (made by Hanson Van Winkle & Munning).
[5] "Weirzin Paint Rite" and "Weirzin Bonderized" plate sold by National Steel.
[6] "Gantrez AN–119—General Aniline & Film Corp.

mined on a solution of 1 gram of copolymer in 100 ml. of methyl ethyl ketone at 25° C. (applied from a 3% aqueous solution).

Another useful overcoating was prepared from a 5% aqueous solution of a water soluble polymer of polyoxyethylene [7] which had a viscosity of 225 to 375 centipoises at 25° C. Other commercially available forms of polyoxyethylene are also useful, particularly those of higher molecular weight.

EXAMPLE IX

With approximately equivalent results, Example I was essentially repeated except for replacement of the polymeric binder of the photopolymerizable layer with A—Poly [styrene/itaconic acid] (90/10) and
B—Poly [methyl methacrylate/itaconic acid] (95/5).

EXAMPLE X

Example VII was essentially repeated except for replacing the initiator (tertiary butyl anthraquinone) with 9,10-phenanthrenequinone. With testing as in Example VII, equivalent results were obtained.

EXAMPLE XI

A plate as described in Example I was coated with a 3% aqueous solution of gelatin (instead of polyvinyl alcohol) containing 2% of the same polyoxyethylene surfactant. The dry coating weight of the gelatin was about 15 mg./dm.². This element gave results comparable with those of Example I when used to make a printing plate.

EXAMPLE XII

An exposed plate as described in Example I was treated with water to just remove the polyvinyl alcohol protective layer. The exposed, photopolymerizable structure, essentially unaffected by the treatment with water, was then developed with a pure organic solvent, diethylene glycol mono-n-butyl ether. The resulting image, which was unusually sharp and clean, produced excellent prints when hand-inked.

EXAMPLE XIII

Silica-treated aluminum sheets, as described in Example I, were coated with thin layers of the following compositions:

| Coating | Grams A | Grams B | Grams C |
|---|---|---|---|
| Pentaerythritol triacrylate, thermally inhibited by containing 0.2% p-methoxyphenol | 15 | 10 | 30 |
| Poly(methyl methacrylate) [1] | 12.5 | ----- | ----- |
| Poly(vinyl acetate) [2] | ----- | 12.5 | ----- |
| Polystyrene [3] | ----- | ----- | 10 |
| t-Butylanthraquionone | 0.3 | 0.3 | 0.3 |
| Phenanthrenequinone | 0.16 | 0.16 | 0.16 |
| Ethyl violet (CI Basic Violet 4) dye | 0.04 | 0.04 | 0.04 |
| Iso-propanol | 88 | 88 | ----- |
| Brought to total weight: | | | |
| With methyl ethyl ketone | 200 | 200 | ----- |
| With toluene | ----- | ----- | 200 |

[1] Low molecular weight, inherent viscosity 0.20.
[2] Av. mol. wt.=45,000; visc. of 86 g. of resin in 1,000 ml. of benzene solution determined at 20° C. with an Ostwald-Cannon-Fenske viscometer=6 to 8 cps.
[3] Specific gravity 1.05–1.07 (ASTM Test Method D792–50), Refraction Index 1.59 (ASTM Test Method D542–50), Thermal coefficient of expanion 6-8 $\times 10^{-5}$ in./in./° C. (ASTM Test Method D696–44).

The three plates were overcoated with a polyvinyl alcohol solution as described in Example I, then exposed for 60 seconds using a Nu Arc Model FT26L Xenon arc. The plates were developed as in Example VI using developer composition "B" of that example and all three plates showed good ink/water differentiation, good adhesion to the plate support, and gave prints having good halftone dot quality.

[7] "Polyox" WSR-35—Carbide & Carbon Chemicals Corp.

EXAMPLE XIV

Silica treated aluminum supports were coated with the following solution to form three photopolymerizable plates:

| | G. |
|---|---|
| Poly-5-vinylpyridine | 5.4 |
| Pentaerythritol triacrylate | 4.4 |
| Tertiary-butylanthraquinone | 0.2 |
| Ethyl Violet (CI Basic Violet 4) dye | 0.01 |
| Methyl ethyl ketone/isopropyl alcohol(1:1) | 73 |

The three plates were overcoated with a polyvinyl alcohol solution as in Example I, exposed through a negative and each developed with one of the following solutions:

(1) Isopropyl alcohol (99%)—after first removing the polyvinyl alcohol protective layer by sponging with water.
(2) Acetic acid 0.1% in water.
(3) A deep etch soltuion consisting of:

| | | |
|---|---|---|
| Calcium chloride 41° Bé. | ml. | 1000 |
| Zinc chloride | g. | 380 |
| Iron perchloride 51° Bé. | ml. | 285 |
| Hydrochloric acid 37–38.5% | ml. | 114 |
| Cupric chloride ($CuCl_2$—$2H_2O$) | g. | 27 |

The plates were dried, postexposed 5 minutes, and gummed with 14° Bé. gum arabic containing 1% sodium metasilicate.

All of these plates showed good ink/water differentiation and printed a number of good copies when used on a commercial printing press.

EXAMPLE XV

The photopolymer solution of Example I, without the ethyl violet dye, was neutratlized with sodium hydroxide using phenolphthalein as an indicator. The solution was coated on a grained aluminum support and overcoated with a polyvinyl alcohol solution as described in Example I. The plate, after exposure through a negative, was developed with the following solution which, it should be noted, contains no alkaline material:

5 ml. 2-n-butoxyethanol
1 ml. polyoxyethylene surfactant,

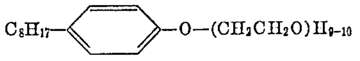

94 ml. water

The plate was coated with a gum etch (32 oz. 14° Bé. gum arabic plus 1 oz. concentrated phosphoric acid). Then the dried plate was post-exposed for 5 minutes in a vacuum frame as in Example I. Using a conventional black printing ink, the plate was able to make 2000 good impressions without appreciable wear.

EXAMPLE XVI

Similar results were obtained when Example I was repeated except for varying the solvent. Thus, the 3:1 methyl ethyl ketone/isopropanol solvent mixture was replaced, in one instance, with ethylene glycol monoethyl ether. The coating solution, as in Example I, contained 20% solids. In another instance, the solvent was trichloroethylene.

EXAMPLE XVII

Similar results were obtained when Example XVI (ethylene glycol monoethyl ether coating) was repeated in all respects except for varying the aluminum support. The plates made and tested employed the following supports:

1—ungrained, unsilicated lithographic aluminum sheet
2—aluminum sheet which was electrolytically etched and anodized (prior to coating)
3—grained, unsilicated lithographic aluminum sheet

EXAMPLE XVIII

Four treated aluminum supports, as described in Example I, were provided with halation protection using a yellow dye (ultraviolet and blue light absorbing) of the structure:

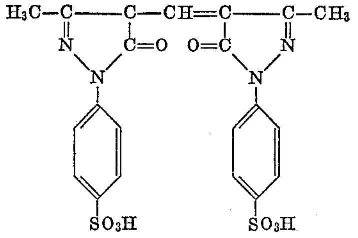

One gram of the dye was dissolved in 100 ml. of a 10/90 mixture of water and ethylene glycol monoethyl ether. The solution was coated on Plate No. 1 and dried by evaporation at room temperature.

Plate No. 2 had an antihalation layer coated from a solution prepared by dissolving 1 part of the yellow dye and 100 parts of the monomer (pentaerythritol triacrylate) in ethylene glycol monoethyl ether to make a solution having 5 g. solids per 100 ml.

Plate No. 3 had an antihalation layer like that of Plate No. 2 except that the pentaerythritol triacrylate monomer was replaced with a like amount of the poly[methyl methacrylate/methacrylic acid] binder of Example I.

Plate No. 4 had an antihalation layer coated from a solution prepared by dissolving 1 part of the yellow dye and 100 parts (on a dry basis) of a photopolymer composition defined below as "Composition No. 1." Ethylene glycol monoethyl ether was the solvent and, for each 100 ml. of solution, there were 5 g. of solids.

Another treated aluminum support, Plate No. 5, had an antihalation layer coated from an aqueous solution containing 0.025 g. per liter of a commercially available, water-soluble, substituted benzophenone ultraviolet-absorbing material (Cyasorb®, American Cyanamid & Chemical Corp.) having an absorption peak at 284 millimicrons.

No exact coating weight of the antihalation coatings were determined but, for Plate No. 1, the reflection optical density through a blue filter was about 0.27, about 0.04 higher than recorded for the aluminum support prior to the antihalation treatment. Plates No. 2, 3, and 4 appeared to have antihalation layers with somewhat higher dye densities. No dye density of the antihalation layer of Plate No. 5 was discernible visibly as this was an ultraviolet absorbing dye.

The following photopolymerizable compositions were prepared:

| Components | Composition No. 1 | Composition No. 2 |
|---|---|---|
| Pentaerythritol triacrylate (g.) | 466 | 576 |
| Poly(methyl methacrylate/methacrylic acid) binder of Example I (g.) | 302 | 624 |
| Polymethyl methacrylate of Example XIII (g.) | 116 | |
| t-Butylanthraquinone (g.) | 8.64 | 9.44 |
| Phenanthrenequinone (g.) | 3.94 | 7.20 |
| Oil Blue A (CI Solvent Blue 36) dye (g.) | 2.0 | 3.6 |
| Ethylene glycol monoethyl ether solvent to form solution of approximately | 35% solids | 37% solids |

Plates No. 2, 3, and 4, with antihalation coatings as described above, were coated with Composition No. 1 to provide photopolymerizable layers of about 30 mg./dm.$^2$ dry coating weight. The plates were then overcoated with a 6% by weight aqueous solution of polyvinyl alcohol (medium viscosity, 88% saponified) containing 2% (based on the dry weight of polyvinyl alcohol) of polyoxyethylene surfactant of the formula

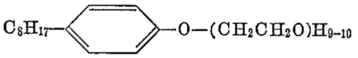

Plates No. 1 and 5 were coated with Composition No. 2 to provide photopolymerizable layers of about 26 mg./dm.$^2$ dry coating weight. In coating Plate No. 5, the Oil Blue dye was replaced by a like amount of Fuchsine (CI Basic Violet 14) dye. These plates were overcoated with a solution of the same polyvinyl alcohol and surfactant used above but which contained (instead of water as the only solvent) about 9% each of ethanol and ethylene glycol monoethyl ether. The polyvinyl alcohol solution was coated to yield very effective oxygen barrier layers with dry thickness of about 0.00003 inch.

All five plates were evaluated as in Example I and found to give essentially similar results except for sharper images due to the antihalation dyes.

Similar results were also obtained when other dyes or ultraviolet absorbers were used in place of those described above. Effective antihalation dyes must be chosen according to the wavelength of the exposing (actinic) radiation which initiates polymerization. Since this initiation is usually in the ultraviolet or blue regions of the spectrum, the ultraviolet-absorbing materials and yellow dyes are particularly effective.

In Plates No. 1 through 4, above, the yellow antihalation dye in combination with the Oil Blue dye in the photopolymerizable layer gave a pleasing green color to the exposed areas of the plate. This was in distinct contrast with the aluminum surface where the photopolymerizable material and dye were removed by development in unexposed areas. In a similar plate, the Oil Blue dye was replaced by a like amount of Victoria Green (CI Basic Green 4) dye which also gave a pleasing color in combination with a yellow antihalation dye.

EXAMPLE XIX

The following photopolymerizable coating compositions were prepared:

| Component | Composition No. (in grams) 1 | 2 | 3 | 4 | 5 | 6 | 7 | 8 |
|---|---|---|---|---|---|---|---|---|
| Pentaerythritol triacrylate | 576 | 406 | 9.5 | 9.5 | 9.5 | 9.5 | 9.5 | 9.5 |
| Triethylene glycol diacetate | | 128 | | | 3.0 | 3.0 | 3.0 | 3.0 |
| Poly(methyl methacrylate/methacrylic acid) binder of Ex. I | 624 | 624 | 14.7 | 14.7 | 14.7 | 14.7 | 14.7 | 14.7 |
| Benzoin methyl ether | | | | | 0.4 | 0.22 | | |
| t-Butylanthraquinone | 9.4 | 9.4 | 0.22 | 0.22 | | | | |
| Phenanthrenequinone | 7.2 | 7.2 | 0.17 | 0.17 | | 0.17 | | 0.17 |
| 2-ethylanthraquinone | | | | | | | 0.4 | 0.22 |
| CI Acid Blue 102 dye | 16 | 16 | 0.3 | 0.3 | 0.3 | 0.3 | 0.3 | 0.3 |
| Polyethylene glycol, mol. wt. 300 | | | 3.0 | | | | | |
| Poly(ethylene glycol succinic acid half ester), mol. wt. 350 | | | | 3.0 | | | | |
| Ethylene glycol monoethyl ether | | | 20 | 20 | 20 | 20 | 20 | 20 |
| Ethylene glycol monoethyl ether to total weight | 3,500 | 3,500 | | | | | | |
| Methyl ethyl ketone to total weight | | | 180 | 180 | 180 | 180 | 180 | 180 |

The above compositions were applied, at a 40 mg./dm.$^2$ coating weight, on standard brush-grained, unsilicated aluminum supports, 0.012 inch in thickness. A protective polyvinyl alcohol overcoating was then applied as described for Plates 2, 3 and 4 of Example XVIII to yield finished plates labeled to correspond with the numbers of the coating composition. The plates were all exposed and processed as in Example VI–B.

Plate No. 1, the control, produced an image essentially equivalent to that of the plate in Example I. All of the other plates were also essentially equivalent except for having twice the speed (or sensitivity to exposing radiation). The speed increase was attributed to the chain transfer agent, triethylene glycol diacetate, in Plates 2 and 5 through 8, polyethylene glycol in Plate 3 and poly-(ethylene glycol succinic acid half ester) in Plate 4. The various initiators and initiator combinations all gave equivalent results.

EXAMPLE XX

| Components | Composition No. (in grams) 1 | 2 | 3 | 4 |
|---|---|---|---|---|
| Pentaerythritol triacrylate | 9.5 | 9.5 | 9.5 | 9.5 |
| Poly(methyl methacrylate/methacrylic acid) binder of Ex. I | 14.7 | 14.7 | 14.7 | 14.7 |
| Methylene Blue (CI Basic Blue 9) dye | 0.2 | 0.2 | 0.2 | 0.2 |
| Triethanolamine | 1.5 | 1.5 | - | - |
| 5,5,dimethyl-1,3-cyclohexanedione | - | - | 0.35 | 0.35 |
| t-Butylanthraquinone | - | 0.22 | - | 0.22 |
| Phenanthrenequinone | - | 0.17 | - | 0.17 |
| Triethylene glycol diacetate | 1.5 | 1.5 | 3.0 | 3.0 |
| Ethylene glycol monoethyl ether | 20 | 20 | 20 | 20 |
| Methyl ethyl ketone to total weight | 180 | 180 | 180 | 180 |

These compositions were applied to metal supports, protected with a polyvinyl alcohol overcoating, exposed, and processed as in Example XIX. All of the compositions contained a dye-redox system as a photoinitiator. Compositions No. 2 and No. 4 additionally contained a combination of quinone photoinitiators and, consequently, had about twice the speed of Compositions No. 1 and No. 3. Triethanolamine and 5,5-dimethyl-1,3-cyclohexanedione (dimedone) were apparently equally effective as electron donors.

All four of the above coatings had the advantage of yielding a visible image immediately upon exposure by dye bleach-out of Methylene Blue.

Another plate in which the photopolymerizable layer embodied a composition similar to No. 1 above was made, but the Methylene Blue was replaced by a like amount of another photoreducible dye, erythrosin. Plate quality and speed were equivalent but the erythrosin was not able to yield a visible image.

EXAMPLE XXI

To serve as a control, Plate A was prepared which was essentially identical to Plate No. 2 of Example XIX. Plate B differed only in the protective overcoating where polyvinyl alcohol was replaced by polyvinyl pyrrolidone having an average molecular weight of 40,000. Plate C also had the polyvinyl pyrrolidone overcoating but the aluminum support was much coarser grained than that used in the other plates. In this case, the aluminum support was roughened by sandblasting so that it had a roughness value of 10 seconds as compared with 218 seconds for the aluminum support used for Plate A when both were tested according to the procedure of J. Bekk, "Apparatus for measuring the smoothness of paper surfaces," June 30, 1932, Paper Trade J. Plate D had the rough surfaced support of Plate C and a polyvinyl alcohol overcoating as in the control (Plate A).

All four plates were exposed for 3 minutes through a continuous tone negative containing a 21-step, square root of two exposure wedge. Exposure and development were as described in Example XIII. Prints were made from each of the 4 plates and, as shown in the table below, the combination of coarse surfaced support and polyvinyl pyrrolidone overcoating gave the greatest number of steps of different printing densities. Also, the pictorial portion of the continuous tone negative was reproduced with greatest fidelity by Plate C.

| Plate | Support | Overcoat | Number of distinctly visible steps printed |
|---|---|---|---|
| A (control) | Standard | PVA | 3 |
| B | do | PVP | 8 |
| C | Coarse | PVP | 10 |
| D | do | PVA | 5 |

A polyvinyl pyrrolidone overcoating has advantages over a polyvinyl alcohol overcoating in preparing a plate from a continuous tone negative because the former is not quite so impermeable to oxygen. The latter is preferable for printing from a halftone negative because, with greater impermeability to the polymerization-inhibiting oxygen, the polyvinyl alcohol overcoated plate is more photosensitive. Further experiments have indicated that good reproduction of continuous tone images can be attained in the complete absence of an overcoating; however, much heavier exposures are required to overcome the oxygen effect.

EXAMPLE XXII

Another plate was made like Plate No. 2 of Example XIX except that half of the polyvinyl alcohol in the overcoating was replaced with polyvinyl pyrrolidone of 40,000 average molecular weight. This plate was essentially equivalent to Plate No. 2 except for improved adhesion between the photopolymerizable layer and the overcoating. Even better adhesion was attained when triethylene glycol diacetate was added to the overcoating composition in a concentration of 2% by weight.

EXAMPLE XXIII

A plate was made similar to that described in Example XIX, using "Composition No. 2" in coating the photopolymerizable stratum. However, the overcoating composition was replaced with an aqueous solution containing 3% by weight polyvinyl alcohol (medium viscosity, 99% saponified), 2% by weight of 4,4'-diazidostilbene-2,2'-disulfonic acid sodium salt, and 2% (based on the dry weight of polyvinyl alcohol) of a polyoxyethylene surfactant of the formula

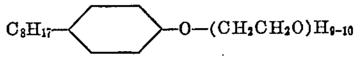

After imagewise exposure as described in Example XIX, the yellow diazide was bleached out to form a clear visible image, useful in checking the plate before processing. With processing carried out as in Example XIX, a satisfactory printing plate was obtained.

EXAMPLE XXIV

Results similar to those obtained in Example XV can be obtained by substituting for the photopolymer solution of Example I the specific polymers containing acid groups that are described in Example IX or by substituting other specific organic polymers containing acid groups including the addition copolymers described in Barney 2,893,868, July 7, 1959. The polymers of this patent contain, for example, lateral free acid groups such as sulfonic, carboxylic and phosphoric acid groups. When these polymers before esterification can be neutralized with a base, for example with an alkali metal hydroxide, e.g., sodium or potassium hydroxide, or a corresponding carbonate or ammonia or substituted ammonium base, e.g., tetramethylammonium hydroxide and tetraethylammonium hydroxide or an organic amine, e.g., ethanolamine, ethylenediamine, diethylenetriamine, 2-amino-2-hydroxymethyl-1,3 - propanediol, 1,3 - diaminopropanol - 2, and morpholine. The free acid groups are converted to salt groups and the resulting layers have the advantage that they can be removed in the aqueous solvents of Example XV or other solvents free from alkali.

Preferred photopolymerizable monomers that can be present in layer (2) include the substantially water-insoluble materials containing two or more terminal ethylenic groups which are disclosed in Plambeck, U.S.P. 2,760,-863 and Burg et al., U.S.P. 3,060,023. Monomers with only a single terminal ethylenic group could be employed but the composition would be considerably less sensitive to actinic radiation. When chain transfer agents are present in the photopolymerizable layer, especially polyolefine oxides as listed in U.S.P. 3,046,127, glycerol and triethylene glycol diacetate, higher speeds are obtained. This is true whether or not the agent is originally present in the layer or migrates from another contiguous layer. As a further advantage, the chain transfer agent, if present in the coating composition of the protective overcoating, improves the adhesion between the photopolymerizable layer and the overcoating. Triethylene glycol diacetate is a particularly preferred compound because its relatively low vapor pressure retards its removal from the element by vaporization. The chain transfer agent, if present, can be used in amounts greater than 0% up to 50% of the ethylenically unsaturated monomer.

Preferred addition polymerization initiators activatable by actinic light and thermally inactive below 185° C. consist of substituted and unsubstituted polynuclear quinones. A large number of specific useful quinones of this type that can be substituted in the examples hereof are described in Notley U.S.P. 2,951,758, Sept. 6, 1960. Thermal addition polymerization inhibitors as described in this patent can be present in the photopolymerizable layers in the amounts set forth in the patent.

Constituents (a) (c) are present in the photopolymerizable layer in amounts from 10 to 60 parts and 90 to 40 parts, by weight, respectively, and constituent (b) should be present in an amount of 0.5 to 10%, by weight, of constituent (a) the ethylenically unsaturated compound.

The photopolymerizable elements of this invention are useful for various pattern or image yielding purposes. They are especially useful in making printing reliefs by the general procedures described in the above-cited Plambeck and Heiart patents. An advantage of the elements is that they have enhanced speed and contrast. Printing plates made from the elements have unusually long press life. The thin protective coatings have advantages over the strippable protective sheets of the prior art. They are thinner than such sheets and have good uniformity and, because of their uniform adherence, are more effective as oxygen impermeable layers.

The embodiments of the invention in which an exclusive property or privilege is claimed are defined as follows:

1. A photopolymerizable element which comprises, in order, (1) a support (2) a photopolymerizable stratum having a weight of 1–90 mg. per square decimeter when dry and comprising (a) at least one non-gaseous ethylenically unsaturated compound containing at least two terminal ethylenic groups, having a boiling point greater than 100° C. at normal atmospheric pressure and being capable of forming a polymer by photoinitiated addition polymerization, (b) an addition polymerization initiator activatable by actinic radiation, and (c) an organic macromolecular polymer binder, and (3) an adherent solid protective stratum transparent to actinic radiation, said protective stratum being characterized in that it has a weight of 2–30 mg. per square decimeter and is homogeneous, non-strippable as an unsupported film, substantially impermeable to oxygen, water-permeable and composed of at least one macromolecular organic polymer that is soluble at 20° C. in water or in a mixture of water and a water-miscible organic solvent containing at least 50% by volume of water.

2. An element according to claim 1 wherein said polymer binder contains lateral, water-soluble salt groups.

3. An element according to claim 1 wherein said support is metal.

4. An element according to claim 1 wherein said support has an antihalation coating.

5. An element according to claim 1 wherein said ethylenically unsaturated compound is water-insoluble and layer (3) contains a surfactant.

6. An element according to claim 1 wherein said ethylenically unsaturated compound is water-insoluble and layer (3) contains a surfactant, said initiator being a polynuclear quinone activatable by actinic radiation and thermally inactive at and below 185° C.

7. An element according to claim 1 wherein said polymer binder is a methyl methacrylate/methacrylic acid copolymer.

8. An element according to claim 1 wherein said polymer binder is a styrene/itaconic acid copolymer.

9. An element according to claim 1 wherein constituents (a) and (c) are present in the respective amounts by weight of 10 to 60 and 90 to 40.

10. A photopolymerizable element which comprises in order, (1) an aluminum sheet support from 0.005 to 0.03-inch in thickness, (2) a photopolymerizable stratum having a weight of 1–90 mg. per square dm. when dry and comprising (a) pentaerythritol triacrylate (b) polynuclear quinone addition polymerization initiator (c) poly(methyl methacrylate) methacrylic acid, and (d) triethylene glycol diacetate, and (3) an adherent protective stratum containing a polyvinyl alcohol, polyvinyl pyrrolidine, triethylene glycol diacetate and a surfactant of the formula

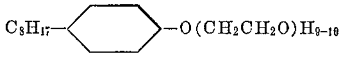

11. A process which comprises exposing, imagewise to actinic radiation, a photopolymerizable element as defined in claim 1 to form an insoluble polymer image in the exposed areas of the stratum and removing the unexposed areas of the stratum with an aqueous solvent media therefor.

12. A process according to claim 11 wherein said solvent media is a mixture of 2-n-butoxyethanol, trisodium phosphate, and water and contains a surfactant.

13. A process according to claim 11 wherein the protective stratum is simultaneously removed with the unexposed areas.

References Cited

UNITED STATES PATENTS

| | | | |
|---|---|---|---|
| 2,791,504 | 5/1957 | Plambeck | 96—115 XR |
| 3,060,026 | 10/1962 | Heiart | 96—115 XR |
| 3,203,805 | 8/1965 | Burg | 96—115 |

NORMAN G. TORCHIN, Primary Examiner

R. H. SMITH, Assistant Examiner

U.S. Cl. X.R.

96—86, 115